United States Patent [19]

Bando et al.

[11] Patent Number: 5,113,122
[45] Date of Patent: May 12, 1992

[54] HORIZONTAL DEFLECTOR APPARATUS

[75] Inventors: Takahiro Bando; Noriyuki Tomimatsu, both of Nagasaki, Japan

[73] Assignee: Mitsubishi Kenki Kabushiki Kaisha, Tokyo, Japan

[21] Appl. No.: 699,580

[22] Filed: May 14, 1991

[51] Int. Cl.$^5$ .................................. H01J 29/56
[52] U.S. Cl. ...................................... 315/371
[58] Field of Search ................ 425/472, 508, 522

[56] References Cited

U.S. PATENT DOCUMENTS 4,305,023 12/1981 Willis .................................. 315/371
4,956,586 9/1990 Gipson et al. ..................... 315/387

Primary Examiner—Theodore M. Blum
Attorney, Agent, or Firm—Burns, Doane, Swecker & Mathis

[57] ABSTRACT

A horizontal deflection apparatus which is provided with a circuit to convert a vertical deflection voltage into a crosswise pincushion distortion correction voltage in a parabola form, a vertical frequency detecting circuit which detects a frequency of a vertical synchronizing signal and outputs a control signal of a voltage corresponding to the frequency, an automatic gain control circuit which amplifies the correction voltage with the gain controlled in response to the control signal corresponding to the outputted vertical frequency and outputs a voltage signal in a parabola form with a fixed amplitude for correcting a crosswise pinchusion distortion, a pulse width modulating circuit which modulates a pulse signal synchronized with a horizontal synchronizing signal in response to the outputted voltage signal from the automatic gain control circuit, and a chopper-type power circuit which chops a power voltage with the pulse width modulating output and gives the chopped power voltage to a horizontal output circuit, thereby correcting the crosswise pincushion distortion in response to the voltage signal with the fixed amplitude irrespective of the change of the vertical frequency, and enabling adequate correction of the crosswise pincushion distortion even if the vertical frequency changes.

3 Claims, 4 Drawing Sheets

HORIZONTAL DEFLECTOR APPARATUS

BACKGROUND OF THE INVENTION

1. Field of the Invention

The present invention relates to a horizontal deflection apparatus which deflects an electron beam in a horizontal direction for scanning a picture tube, and more in particular, to an improvement of the art to correct a horizontal width and crosswise pincushion distortion of a screen in accordance with a plurality of horizontal and vertical frequencies.

2. Description of Related Art

There has conventionally been manufactured a display apparatus, in which each of the horizontal and vertical frequencies is adapted to correspond to a single frequency. FIG. 1 is a block diagram to illustrate the construction of a horizontal deflection apparatus used in the conventional display apparatus. In the figure, reference numeral 21 represents a monostable multivibrator driven in response to a horizontal synchronizing signal H, and an output pulse of this monostable multivibrator 21 is given to an integrator 22 in which the output pulse is smoothed to obtain an output voltage Vr. The output voltage Vr outputted from the integrator 22 is transmitted to a positive input terminal of an error amplifier 23, which is rendered a reference voltage for comparison with a feedback voltage inputted to a negative input terminal of the error amplifier 23 as will be described later. The negative input terminal of the error amplifier 23 is earthed via a resistance 26. An error output of the error amplifier 23 is given to a voltage stabilizing circuit 24 which outputs a stabilization voltage $V_B$ in accordance with the error output. While this stabilization voltage $V_B$ is fed back to the negative input terminal of the error amplifier 23 via a resistance 25, this is inputted as a power source to a horizontal output circuit 28 via a choke coil 27 which is comprised of a coil of a horizontal output transformer or the like. The horizontal output circuit 28 is well known as it consists of such elements as a horizontal output transistor 29, a damper diode 30, a resonance capacitor 31, a horizontal deflection coil 32, a crosswise pincushion distortion correcting transformer 33, an S distortion correcting capacitor 34, and the like.

Reference numeral 35 indicates an output terminal of a vertical deflection voltage $V_D$ which is outputted from a vertical output circuit (not shown), and the outputted vertical deflection voltage Vd is applied to a vertical deflection coil 36 which is comprised of a coil of a vertical output transformer or the like. Via the vertical deflection coil 36, the vertical deflection voltage $V_D$ is given to one electrode of a capacitor 37, and converted into a crosswise pincushion distortion correction voltage in the form of a parabola. While the other electrode of the capacitor 37 is connected to one end of a secondary coil of the correcting transformer 33, a +B power voltage inputted to a +B power terminal 38 is added thereto via a resistance 39. Between both ends of the secondary coil of the correcting transformer 33 are provided a vertical frequency resonance capacitor 40 and a resonance resistance 41.

Now the operation of the conventional horizontal deflection apparatus in the above construction will be described below.

When the horizontal synchronizing signal H is applied to the monostable multivibrator 21, a pseudo horizontal synchronizing signal is obtained which has a fixed pulse width irrespective of the horizontal frequency. And when this signal is passed through the integrator 22, there is obtained the voltage Vr which is proportional to the frequency of the horizontal synchronizing signal, that is, the horizontal frequency. With this voltage Vr as the reference voltage, the error amplifier 23 is actuated and its error output is fed back to the voltage stabilizing circuit 24.

Both the monostable multivibrator 21 and integrator 22 constitute a frequency-voltage conversion circuit which generates the reference voltage Vr corresponding to the horizontal frequency. In accordance with the change of the reference voltage Vr, the stabilization voltage $V_B$ outputted from the voltage stabilizing circuit 24 is changed, whereby, the value of a horizontal deflection current, that is, horizontal amplitude is maintained constant.

In order to correct a crosswise pincushion distortion of the screen, the vertical deflection voltage $V_D$ is converted into a correction voltage in the form of a parabola by the vertical deflection coil 36, capacitor 37, and the like, so that the amplitude of the above horizontal deflection current is modulated via a resonance circuit which is comprised of the correcting transformer 33, capacitor 40, resistance 41, and the like.

When the conventional horizontal deflection apparatus constructed in the above-described fashion is to correct the crosswise pincushion distortion, it employs the resonance circuit which is comprised of the correcting transformer 33, capacitor 40, and resistance 41 and which resonates at a fixed vertical frequency, and accordingly, the resonance circuit may not resonate, when the vertical frequency changes, resulting in such a problem that the crosswise pincushion distortion is not adequately corrected.

SUMMARY OF THE INVENTION

The foregoing problem is solved by the present invention, and an object of the present invention is to provide a horizontal deflection apparatus capable of correcting a crosswise pincushion distortion irrespective of the change of a vertical frequency in a manner whereby a correction voltage in the form of a parabola is applied to an automatic gain control circuit in which a gain of the correction voltage is controlled in response to a control signal corresponding to the vertical frequency so as to obtain a predetermined amplitude of the parabola voltage, and a pulse width of a horizontal synchronizing signal is modulated with the parabola voltage whose amplitude has been set to be the predetermined value, and then a chopper-type power circuit is switched with the pulse width modulated output, and the switching output is fed to a horizontal output circuit.

In the horizontal deflection apparatus of the present invention, the amplitude of the correction voltage in the form of a parabola outputted from the automatic gain control circuit becomes a constant value irrespective of the change of the vertical frequency, so that the correcting volume of the crosswise pincushion distortion becomes always a constant and, the crosswise pincushion distortion can always be corrected adequately even if the vertical frequency is changed.

The above and further objects and features of the invention will more fully be apparent from the following detailed description with accompanying drawings.

DESCRIPTION OF THE PREFERRED EMBODIMENT

Figure 1:
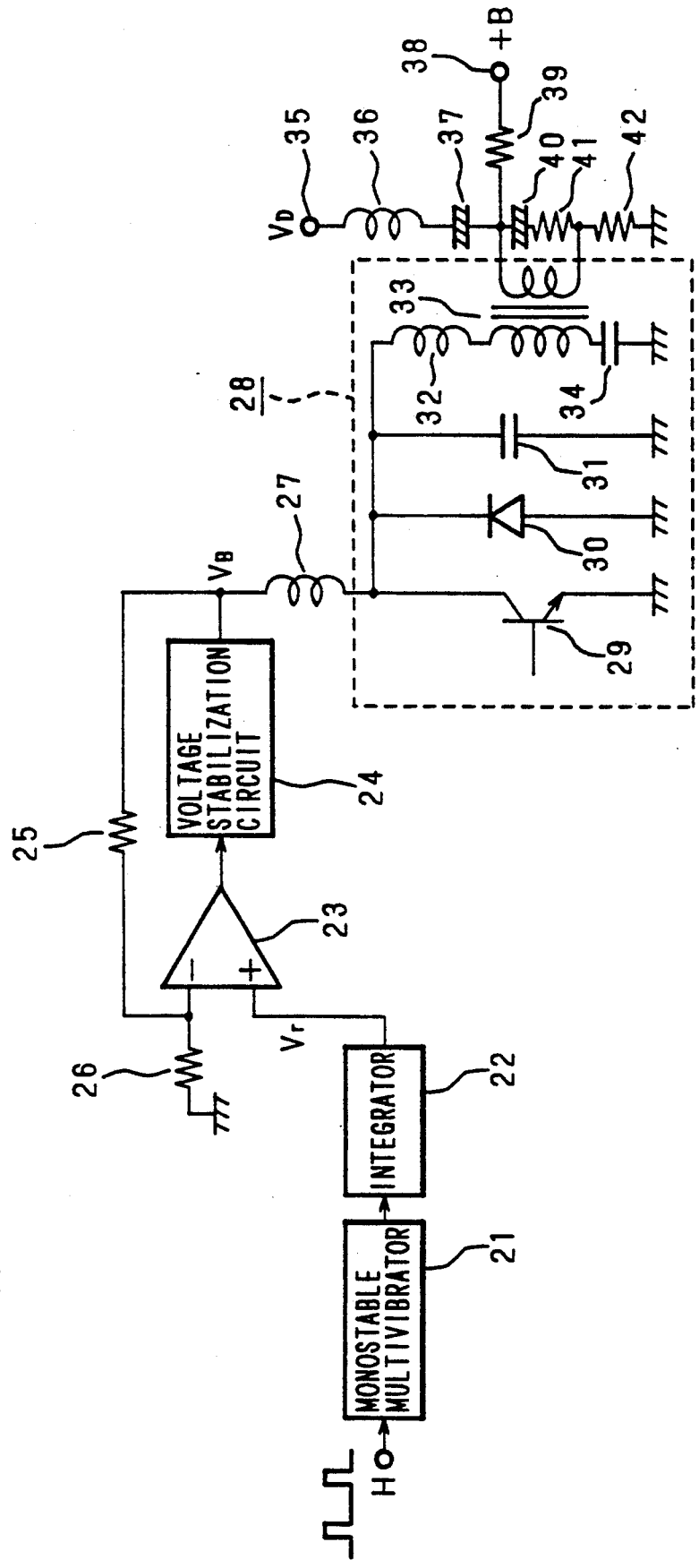
FIG. 1 is a block diagram to illustrate the construction of a conventional horizontal deflection apparatus.
Figure 2:
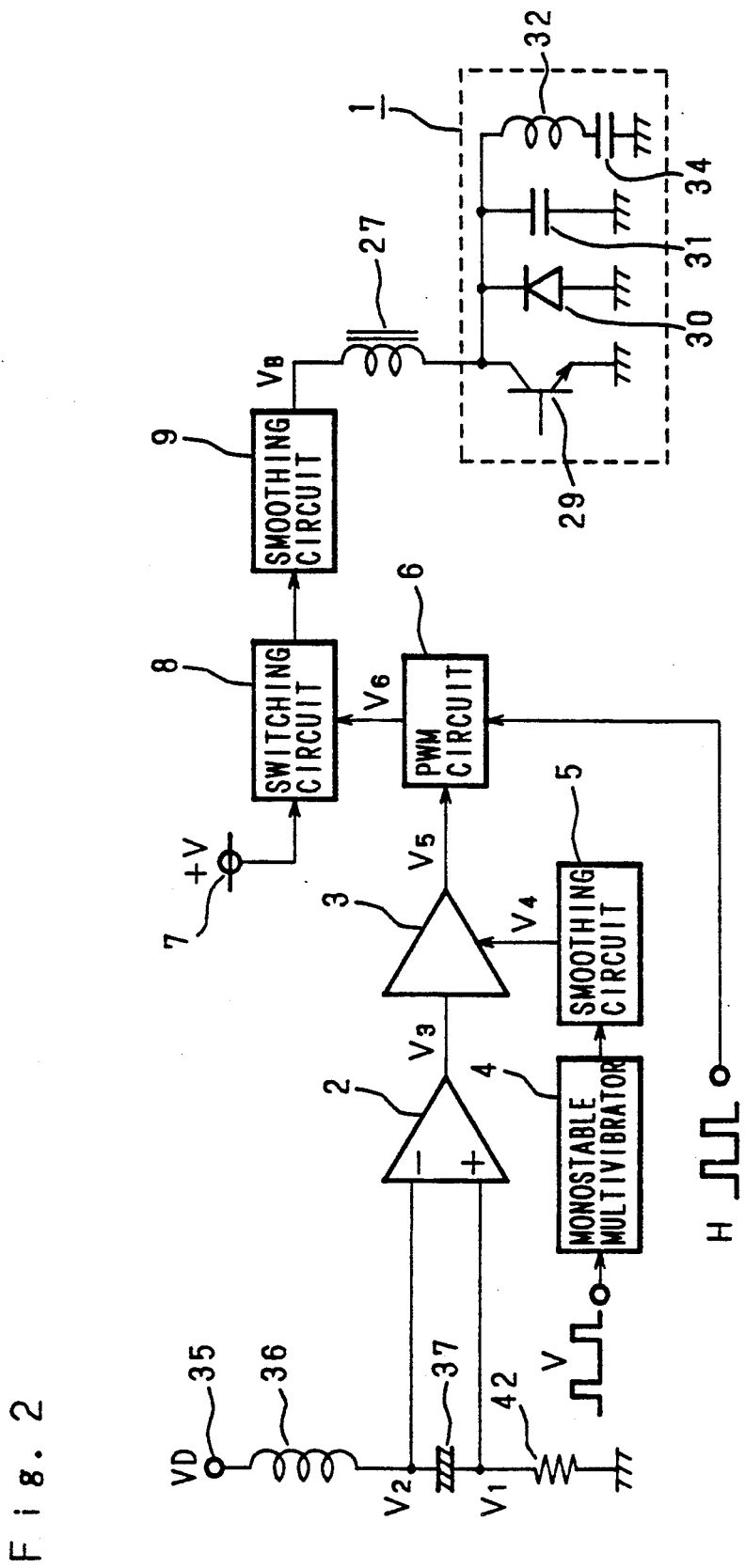
FIG. 2 is a block diagram to illustrate the construction of a horizontal deflection apparatus of one embodiment of the present invention.

Now will be described below a preferred embodiment of the present invention with reference to the accompanying drawings. In FIG. 2, reference numeral 35 indicates an output terminal of a vertical deflection voltage $V_D$ which is outputted from a vertical output circuit (not shown), and the outputted vertical deflection voltage $V_D$ is sent to a vertical deflection coil 36. Via the vertical deflection coil 36, the vertical deflection voltage $V_D$ is given to one electrode of a capacitor 37. The other electrode of the capacitor 37 is earthed via a resistance 42. Voltages $V_1$, $V_2$ at both ends of the capacitor 37 are inputted to negative and positive input terminals of a differential amplifier 2, respectively, and the differential amplifier 2 outputs a correction voltage $V_3$ in the form of a parabola as a differential output to an automatic gain circuit 3 which is comprised of an electron volume and the like. In the automatic gain circuit 2, a gain is controlled in response to a control signal of a voltage $V_4$ corresponding to a vertical frequency obtained by smoothing an output pulse from a monostable multivibrator 4 driven in response to a vertical synchronizing signal V in a smoothing circuit 5. The inputted correction voltage $V_3$ is amplified to be an output voltage $V_5$ in the form of a parabola with a fixed amplitude and is outputted to a PWM (Pulse Width Modulation) circuit 6. The PWM circuit 6 outputs a pulse that is modulated in accordance with the amplitude of the output voltage $V_5$ and that triggered by a horizontal synchronizing signal H. A PWM output pulse $V_6$ is outputted to a switching circuit 8 including switching elements such a transistor and the like. The switching circuit 8 receives a voltage $+B$, switches this voltage with the PWM output pulse $V_6$, and outputs to a smoothing circuit 9. The smoothing circuit 9 smoothes the switching output and outputs the same as a power voltage $V_B$ via a choke coil 27 which is comprised of a coil of a horizontal output transformer or the like to a horizontal output circuit 1.

The horizontal output circuit 1 is comprised of well known elements, i.e., horizontal output transistor 29, damper diode 30, resonance capacitor 31, horizontal deflection coil 32, S distortion correcting capacitor 34, and the like, with a crosswise pincushion distortion correcting transformer being omitted.

In the meantime, the capacitor 37 and the differential amplifier 2 constitute a correction voltage generating means for obtaining the correction voltage $V_3$, and the monostable multivibrator 4 and the smoothing circuit 5 constitute a vertical frequency detecting means for converting the vertical frequency into the voltage $V_4$. The switching circuit 8 and the smoothing circuit 9 constitute a chopper-type power circuit.

The operation of the horizontal deflection apparatus of the present invention thus constructed will be discussed hereinbelow.

Figure 3:
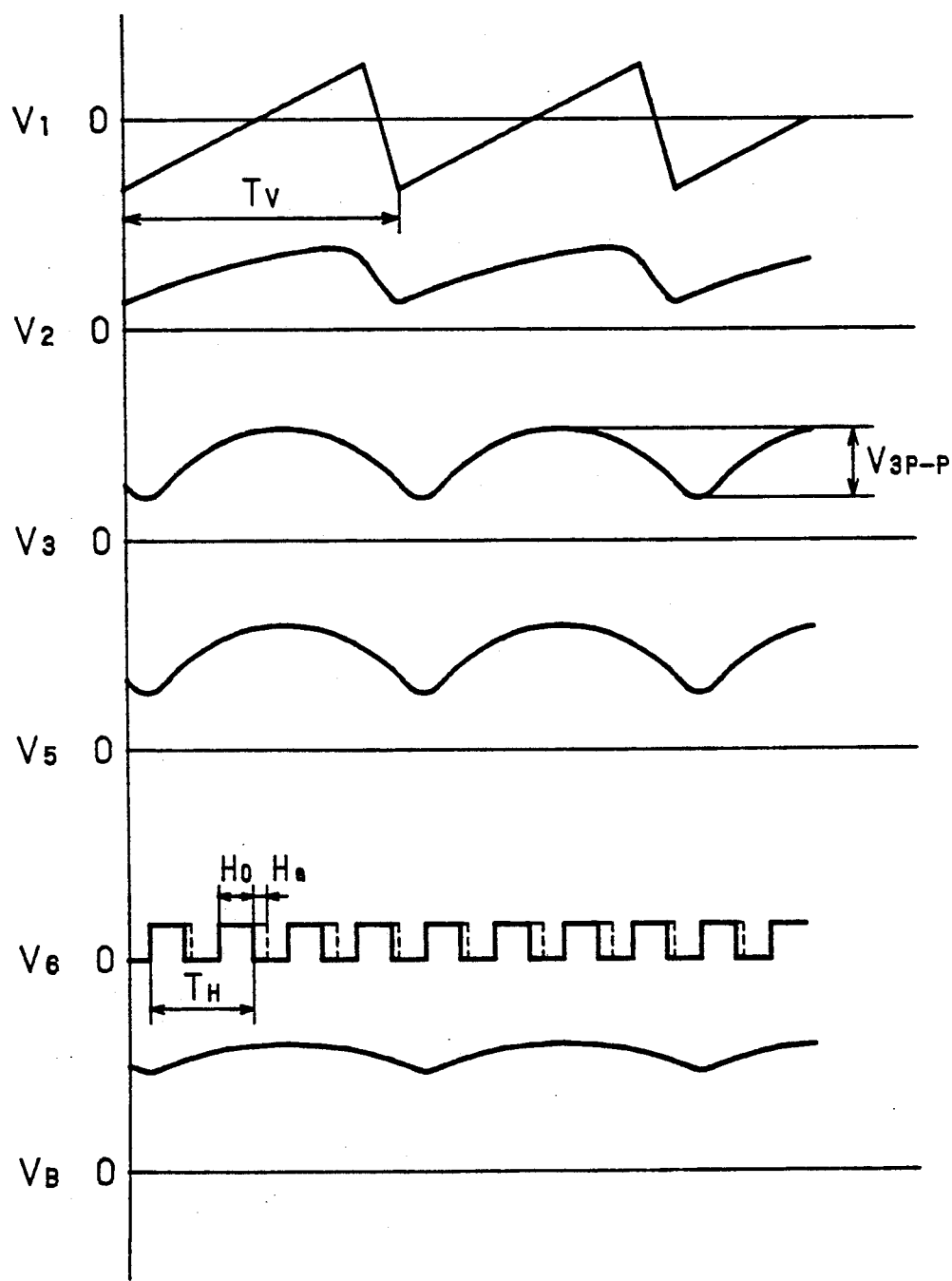
FIG. 3 shows waveforms of an output of the main portion of the apparatus.

The saw-tooth wave voltage $V_1$ of a vertical period $T_v$ and the parabola voltage $V_2$ as shown in FIG. 3 are obtained at both ends of the capacitor 37. When these voltages $V_1$, $V_2$ are applied to the differential amplifier 2 as a differential output thereof, the correction voltage $V_3$ in the form of a parabola shown in FIG. 3 is obtained. Accordingly, this correction voltage $V_3$ has the amplitude corresponding to the vertical frequency, and is sent to the automatic gain control circuit 3.

Meanwhile, when a pulse with a fixed width obtained from the monostable multivibrator 4 driven in response to the vertical synchronizing signal V is smoothed by the smoothing circuit 5, it becomes the voltage $V_4$ corresponding to the vertical frequency. The automatic gain control circuit 3 controls the gain of the above correction voltage $V_3$ with the above voltage $V_4$ as a control signal. As a result, irrespective of the change of the vertical frequency, the correction voltage $V_5$ in the form of a parabola with a predetermined amplitude is obtained from the automatic gain control circuit 3, which is in turn sent to the PWM circuit 6. This PWM circuit 6 outputs the pulse $V_6$ which has the same period as a horizontal period $T_H$ and a pulse width $Ho + Ha$ corresponding to the amplitude of the above correction voltage $V_5$ at the timing of the horizontal synchronizing signal H, wherein Ho designates a reference pulse width, Ha indicating a correction pulse width corresponding to the amplitude of the correction voltage $V_5$. The switching circuit 8 switches the $+B$ power voltage with the pulse voltage $V_6$ as a switching pulse. When this switching output is smoothed by the smoothing circuit 9, the voltage $V_B$ is obtained. And when the horizontal output circuit 1 is operated with this voltage $V_B$, the horizontal deflection current is substantially modulated with the above correction voltage $V_5$, thus correcting the crosswise pincushion distortion.

Figure 4:
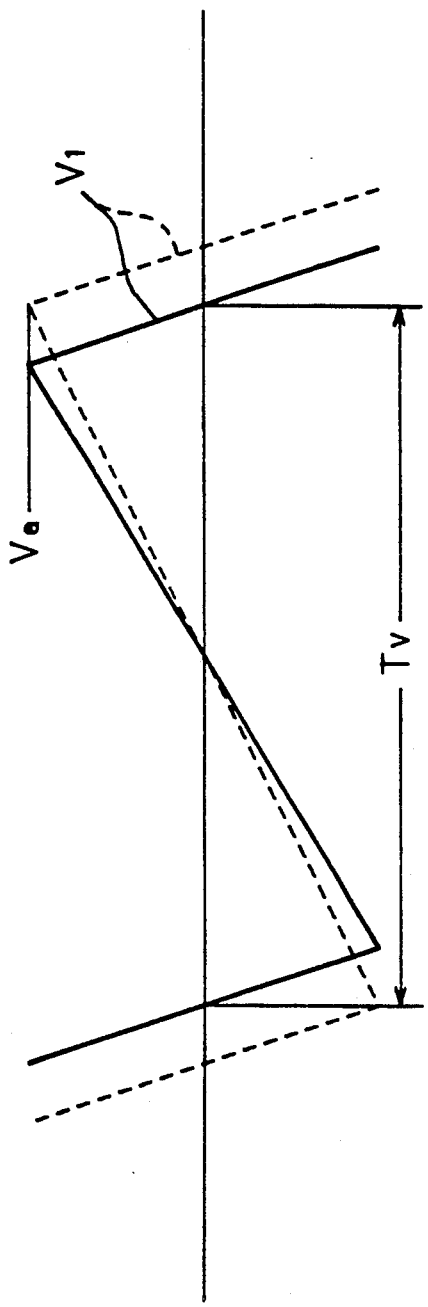
FIG. 4 shows the waveform of the change of a vertical deflection voltage.

Now it will be discussed how the above correction voltage $V_3$ changes in the case where the vertical frequency changes. Assuming that the above voltage $V_1$ is changed from the waveform of a solid line to the waveform of a broken line (where the vertical frequency is lowered) as shown in FIG. 4 and that the amplitude of $V_1$ is designated by Va, the vertical period by Tv, and the value of the resistance 42 by R, the volume of the electric charge blowing into the capacitor 37 at half the vertical period is expressed by $Va/R \times Tv/2$. The peak-peak value ($V_3p$-p) of the amplitude of the correction voltage $V_3$ is proportional to the formula $Va/R \times Tv/2 \times 1/C$ (C represents the capacity of the capacitor 37), and then, as the vertical period Tv becomes larger, the value $V_3p$-p becomes larger. Where the amplitude of $V_1$, that is, the vertical amplitude Va is assumed to be a fixed value, the value $V_3p$-p changes in accordance with the vertical frequency. If the PWM circuit 6 is actuated directly with the value $V_3p$-p, the correcting volume is changed according to the frequency, whereby a good screen cannot be achieved. Therefore, this embodiment employs the automatic gain control circuit 3, thereby making the correcting volume constant at all times through control of the gain or the circuit so that the amplitude of the parabola waveform of the voltage $V_5$ inputted to the PWM circuit 6 can always be constant irrespective of the frequency. The vertical frequency is detected so as to control the gain. The voltage $V_4$ proportional to the vertical frequency is obtained by the monostable multivibrator 4 and the smoothing circuit 5, and the gain of the automatic gain control circuit 3 is adjusted automatically.

As described above, according to the present invention, while the power source of the horizontal output circuit is obtained by a chopper circuit comprising the PWM circuit wherein the crosswise pincushion distortion correcting voltage is superposed on the horizontal synchronizing signal, the crosswise pincushion distortion correcting volume is adapted not to be changed at the vertical frequency by using the automatic gain control circuit. Therefore, even if the horizontal frequency and the vertical frequency are changed, the horizontal amplitude and the crosswise pincushion are automatically corrected thereby to obtain a good screen.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A horizontal deflection apparatus which deflects an electron beam in a horizontal direction for scanning a picture tube that is scanned by said electron beam in synchronization with a horizontal synchronizing signal in the horizontal direction as the main scanning direction and is scanned by said electron beam in synchronization with a vertical synchronizing signal in a vertical direction as the subscanning direction comprising:

a correction voltage generating means for generating a correction voltage of parabolic form with an amplitude corresponding to the vertical frequency of said vertical synchronizing signal so as to correct a crosswise pincushion distortion;

a vertical frequency detecting means for detecting said vertical frequency;

an automatic gain control circuit which controls gain of the correction voltage generated by said correction voltage generating means in response to the vertical frequency detected by said vertical frequency detecting means and outputs a signal of parabolic form with a predetermined constant amplitude irrespective of changes of said vertical frequency;

a pulse width modulating circuit which modulates a pulse signal synchronized with said horizontal synchronizing signal in response to the output signal with the predetermined amplitude of said automatic gain control circuit;

a chopper power circuit which chops a power voltage with the output pulse of said pulse width modulating circuit; and a horizontal output circuit which is operated with the output voltage of said chopper power circuit.

2. A horizontal deflection apparatus as set forth in claim 1, wherein said correction voltage generating means comprises a capacitor having a vertical deflection voltage of a vertical output circuit for scanning in the vertical direction applied to one electrode thereof via a vertical deflection coil and, a differential amplifier which receives the voltage between at both ends of said capacitor.

3. A horizontal deflection apparatus as set forth in claim 1, wherein said vertical frequency detecting means comprises a monostable multivibrator which is driven in response to said vertical synchronizing signal and a smoothing circuit which smoothes an output of said monostable multivibrator and outputs a voltage corresponding to said vertical frequency.

* * * * *

UNITED STATES PATENT AND TRADEMARK OFFICE
CERTIFICATE OF CORRECTION

PATENT NO. : 5,113,122

DATED : May 12, 1992

INVENTOR(S) : Takahiro BANDO, et al.

It is certified that error appears in the above-identified patent and that said Letters Patent is hereby corrected as shown below:

ON THE TITLE PAGE:

[73] Assignee: Mitsubishi Denki Kabushiki Kaisha

Signed and Sealed this

Thirty-first Day of August, 1993

Attest:

BRUCE LEHMAN

Attesting Officer     Commissioner of Patents and Trademarks